United States Patent [19]
Kiml

[11] Patent Number: 5,751,692
[45] Date of Patent: May 12, 1998

[54] BUS SIGNAL DETECTOR

[75] Inventor: Helmut Kiml, Tiefenbach, Germany

[73] Assignee: Texas Instuments Deutschland GmbH, Germany

[21] Appl. No.: 485,256

[22] Filed: Jun. 7, 1995

[51] Int. Cl.[6] .......................... H03K 11/00; H04L 25/64
[52] U.S. Cl. ............................ 370/85.1; 375/214
[58] Field of Search ..................... 370/85.1, 16; 327/18, 327/24, 77, 165, 335, 344; 375/214, 257, 318; 178/63 C, 63 E

[56] References Cited

U.S. PATENT DOCUMENTS

| | | | |
|---|---|---|---|
| 3,527,887 | 9/1970 | Clapp et al. | 327/24 |
| 4,229,831 | 10/1980 | Lacher | 455/619 |
| 4,266,099 | 5/1981 | Kayalioglu et al. | 375/214 |
| 4,480,276 | 10/1984 | Batey et al. | 360/46 |
| 5,307,196 | 4/1994 | Kinoshita | 375/318 |
| 5,392,317 | 2/1995 | Cho et al. | 375/318 |
| 5,491,434 | 2/1996 | Harnishferger et al. | 327/65 |

FOREIGN PATENT DOCUMENTS

A-3325411   2/1984   Germany.

*Primary Examiner*—Douglas W. Olms
*Assistant Examiner*—Chau T. Nguyen
*Attorney, Agent, or Firm*—David S. Guttman; Richard L. Donalds

[57] ABSTRACT

A bus signal detector for a signal transmitted via a bus (12) has an edge detector (14) which supplies a signal ($S_{F1}$) indicating the occurrence of a signal edge (F1) when the voltage on the bus (12) suddenly changes by at least a predetermined relative threshold ($\Delta U_s$) in relation to a reference voltage ($V_{ref}$) continuously adapted to the quiescent voltage of the bus ($_{12}$). An evaluating circuit following the edge detector (14) uses the signal ($S_{F1}$) supplied by the edge detector (14) to produce an output signal indicating a bus signal.

3 Claims, 2 Drawing Sheets

BUS SIGNAL DETECTOR

FIELD OF THE INVENTION

My invention relates to a circuit for detecting a signal transmitted as a voltage level change on a bus.

BACKGROUND OF THE INVENTION

Buses are as a rule employed as a common transmission path for data exchange between two or more connected electronic devices. In bus systems it is possible to more particularly transmit address, data and/or control signals. Communication between individual devices requires reliable recognition by the devices of the data signals received via the bus. For this purpose in known symmetrically operated 2-wire systems comparators are employed, by which the received signal is directly compared with a set reference signal. In symmetrically operated 2-wire systems such a comparison is performed with a set reference signal for instance if one of the two lines fails and consequently communication must take place exclusively using the intact line. In this case the set reference voltage level is applied to the input, associated with the failed line of the comparator, employed in the bus system.

However a problem in the case of such a conventional bus system is that a shift in the ground level, due for instance to pick-up of stray fields, is likely to impair, or even render impossible, signal recognition. More particularly, it is not possible to exclude the chance of a shift of the ground level as far as a point near the set reference signal level. At least in the latter case unambiguous signal recognition is practically out of the question.

One object of my invention is that of creating a circuit arrangement of the type initially mentioned, which while possessing a very simple structure, ensures signal recognition which is as reliable as possible.

This object is to be attained by the invention by having at least one edge detector, which supplies a signal representative for the occurrence of a signal edge, when the voltage level present on the bus changes abruptly by at least one predetermined relative threshold value in relation to a reference voltage level adapted continuously to the quiescent voltage level of the bus and by an evaluating circuit, connected with the output of the edge detector, which starting with the signal supplied by the edge detector produces an output signal representative for the bus signal.

In accordance with this, the received signal is detected in the invention on the basis of positive and/or negative edges occurring, the abrupt voltage level change occurring with such an edge being compared with a reference voltage level continuously adapted to the respective quiescent voltage level of the bus. The predetermined relative threshold value, by which the voltage level has to change in the course of such a jump in level in relation to the automatically adapted reference voltage level, is conveniently smaller than the voltage level change normally defining the signal. The output signal, which is representative for the respective bus signal, is produced by the evaluating circuit, after a respective signal edge has been reliably detected using the given criteria. Owing to the design in accordance with the invention, freedom from interference is substantially increased. While on the one hand there is no chance of slow changes in level being interpreted as signal edges, on the other hand the continuous automatic adaptation of the reference voltage level to the quiescent voltage level of the bus means that more particularly, even in the case of any displacement of the ground level, signal recognition will always be satisfactory.

In order to prevent spikes and/or drops in level, caused for example by pick-up, being interpreted as signals, there is preferably a provision such that the evaluating circuit only produces or discontinues the output signal, if after detection of the respective signal edge the voltage level present at the bus departs during a predetermined minimum time by at least the predetermined relative threshold value from the reference voltage level. This minimum time is preferably larger than the time constant, with which the reference voltage level is adapted to the quiescent voltage level of the bus. Accordingly it is possible to ensure inter alia that the next level change occurring on the bus is in each case compared with the updated reference voltage level.

In accordance with a still further development of the invention, the edge detector comprises a memory element and a charge circuit, by which the memory element may be charged up to the quiescent voltage level of the bus in order to produce the reference voltage level. In this respect the edge detector furthermore comprises a comparator, which compares the voltage level on the bus with the reference voltage level in order to supply the signal which represents the occurrence of a signal edge when the voltage level present on the bus departs by at least the predetermined relative threshold value from the reference voltage level.

The charge circuit preferably possesses a differential amplifier and a series circuit placed between the output thereof and ground, and it comprises a first resistor, provided on the side of the amplifier output and a capacitor which is connected with ground and constitutes the memory element, a first input of the differential amplifier being acted upon by the voltage level of the bus and a second input being connected with the node between the first resistor and the capacitor. Between the first input of the differential amplifier and ground a series circuit is connected which comprises a diode setting the relative threshold value and provided on the side of the amplifier input, and a second resistor connected with ground. In this respect a first input of the comparator is connected with the node present between the diode and the second resistor whereas the second input thereof is connected with the node between the first resistor and the capacitor. The edge detector accordingly supplies a pulse-like signal, whose width is determined by the time required to charge up the capacitor C to a level below the changed bus level by the predetermined threshold value. Then furthermore, the time constant of the first RC series circuit will determine the rate of adaptation of the reference-voltage level to the voltage level present on the bus. It is preferably selected to be less than the preferred minimum time necessary for the voltage level carried by the bus to depart from the reference voltage level by at least the relative threshold value set by the diode in order to ensure that the evaluating circuit produces the output signal.

It is an advantage if each signal-carrying bus line has two edge detectors, of which one supplies a signal representative for the occurrence of a positive signal edge and the other supplies a signal representative for the occurrence of a negative signal edge.

In the case of a symmetrically operated bus, the different bus lines are preferably provided with separate edge detectors, which are connected with a common evaluating circuit. In this respect the circuit arrangement may comprise an error recognition and indicating means checking the proper function of the different bus lines, it preferably automatically changing over to single line operation on the failure of one bus line.

DETAILED DESCRIPTION

Figure 1:
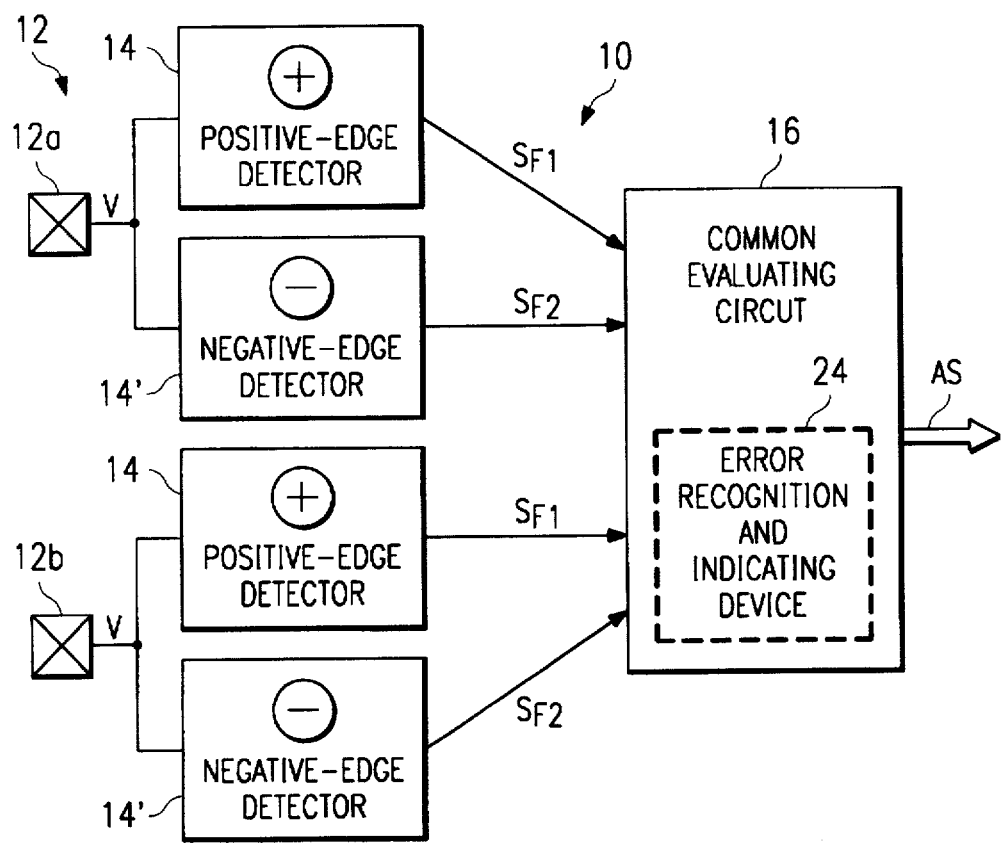
FIG. 1 is a block diagram of an embodiment of my bus signal detector for use with a symmetrically operated two-wire bus for detecting signals transmitted via the bus.

The bus signal detector 10 of FIG. 1 serves for the reception of signals which are transmitted via a symmetrically operated two-wire bus 12. In the case of such symmetrical transmission complementary signals are fed to two wires of the bus lines 12a and 12b.

Each of the two signal-carrying bus lines 12a and 12b has two edge detectors 14 and 14' associated with it. In this respect the edge detector 14 of a respective pair of detectors supplies a signal $S_{F1}$, representative for the occurrence of a positive signal edge F1 (see also FIGS. 3A–3F), whereas the other edge detector 14' supplies a signal $S_{F2}$ representative for the occurrence of a negative signal edge F2.

Whereas the inputs of each respective pair 14 and 14' of a respective edge detectors are connected together and with the particular bus line 12a or respectively 12b, the outputs of the edge detectors 14 and 14' are connected with separate inputs of a common evaluating circuit 16. This common evaluating circuit 16 accordingly receives signals $S_{F1}$, and $S_{F2}$ supplied by the four edge detectors 14 and 14' and representative for the occurrence of a positive signal edge F1 and, respectively, a negative signal edge F2. Starting with such four detector signals the common evaluating circuit 16 produces an output signal AS representative for the bus signal BS (see also FIGS. 3A–3F) transmitted via the two bus lines 12a and 12b in a complementary form.

Each of the edge detectors 14 and 14' depicted in FIG. 1 is so designed that it supplies the signal $S_{F1}$ and $S_{F2}$ representative for the occurrence of the respective signal edge F1 and F2, when the voltage level V present on the respective bus line 12a and 12b suddenly jumps by at least one predetermined relative value $\Delta U_s$ (see also FIGS. 3A–3F) in relation to a reference voltage $V_{ref}$ continuously adapted to the quiescent voltage level of the bus line 12a and 12b.

Figure 2:
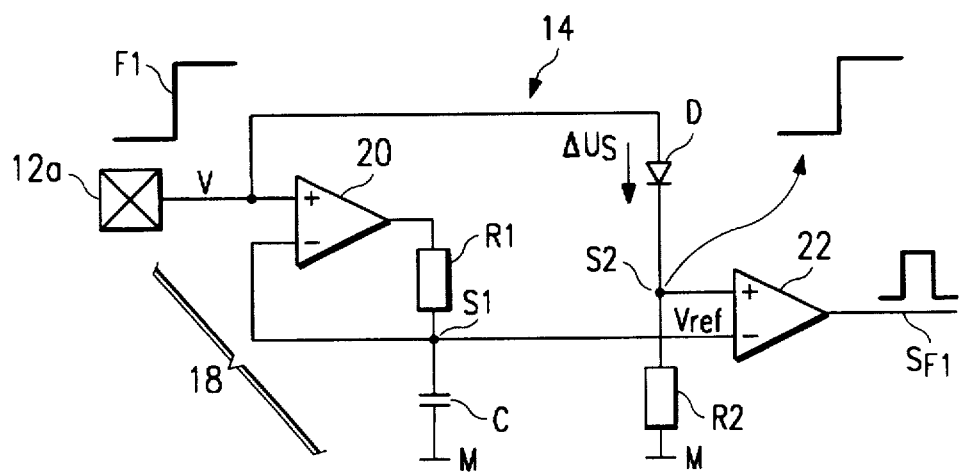
FIG. 2 is a schematic of an edge detector utilized in the bus signal detector of FIG. 1.

FIG. 2 shows the circuit diagram of an edge detector 14 employed in the circuit arrangement 10 of FIG. 1 for the production of a signal $S_{F1}$, representative of the occurrence of a positive signal edge F1.

This edge detector 14 possesses a memory element in the form of a capacitor C and furthermore a charge circuit 18, by which the capacitor C is able to be charged up to the quiescent voltage level of the bus line 12a in order to produce the respective reference voltage level $V_{ref}$.

The charging circuit 18 is constituted by a differential amplifier 20 and a series circuit R1 and C, placed between its output and ground M including a first resistor R1 connected with the amplifier output and the capacitor C constituting the memory element and connected with ground M. The positive input of the differential amplifier 20 is connected with the bus line 12a, while its negative input is connected with the circuit node S1 supplying the reference voltage level $V_{ref}$ between the first resistor R1 and the capacitor C. Between the positive input of the differential amplifier 20 and ground M a series circuit D and R2 is connected comprising a diode D connected on the anode side with the positive input of the differential amplifier 20 and with a second resistor R2 connected with ground M. The edge detector 14 comprises furthermore a comparator 22, which compares the voltage level V available at the bus line 12a with the reference voltage level $V_{ref}$ in order to supply a signal $S_{F1}$, representative for the occurrence of the positive signal edge F1, when the voltage level V present on the bus line 12a differs by at least the predetermined relative threshold value $\Delta U_s$,determined by the turned-on state voltage of the diode D from the reference voltage level $V_{ref}$.

For this purpose the positive input of the comparator 22 is connected with the circuit node S2 between the diode D and the second resistor R2, whereas the negative input thereof is connected with the node S1 placed between the first resistor R1 and the capacitor C. The edge detectors 14' utilized in the circuit arrangement 10 for the production of a signal $S_{F2}$ representative of the occurrence of a negative signal edge F2 are designed in a similar manner, in which respect however preferably the diode D is set with a reversed polarity between the differential amplifier 20 and the comparator 22, the resistor R2 is connected with Vcc instead of with ground M, and the inputs of the comparator 22 are changed over.

The manner of functioning of the circuit arrangement in accordance with the invention will now be explained in more detail, reference being had to the voltage level plots depicted in FIG. 3.

If for example the edge detector 14 illustrated in FIG. 2 is examined, which serves for the production of a signal $S_{F1}$ representative of a positive signal edge F1, it will be seen that the capacitor C is charged up in accordance with the time constant τ=R1*C to the respective quiescent voltage level of the bus line 12a. The differential amplifier 20 in fact ensures that the capacitor C is in all cases charged up via the resistor R1 to such an extent that the differential voltage occurring between its two inputs is zero. As soon as this state is attained, the node S1 connected with the negative input of the differential amplifier will be at the same voltage level as the positive input connected with the bus line 12a.

Figure 3A:
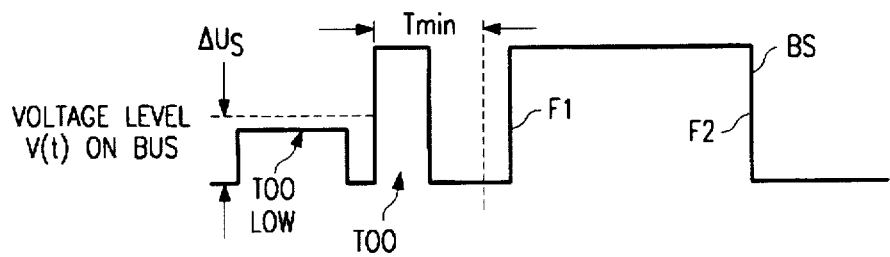
FIG. 3A–3F shows plots of signals at different points in my bus signal detector and in the edge detector of FIGS. 1 and 2.
Figure 3B:
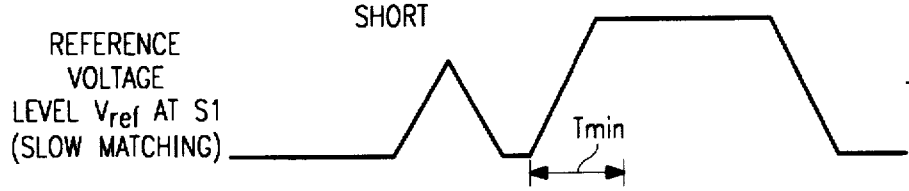

As will be perceived from the graphs in FIGS. 3A and 3B, which respectively show the voltage level V of the bus line 12a and the reference voltage level $V_{ref}$ at the node S1 against time t, the rise time of the positive edge F1 of a respective bus signal BS is substantially smaller than the time constant τ with which the reference voltage level $V_{ref}$ is adapted to the respective quiescent voltage level of the bus line 12a and, respectively, the capacitor C is charged.

If now the positive edge F1 of a bus signal BS occurs on the bus line 12a, a current will flow via the diode D and the second resistor R2 and will cause across the second resistor R2 a voltage drop by which the voltage level at the node S2 is correspondingly increased. The voltage level at this node S2 connected with the positive input of the comparator 22 is less the voltage level V of the bus line 12a by an amount equal to the turned-on voltage of the diode D. The turned-on voltage of the diode D consequently sets the predetermined relative threshold value $\Delta U_s$ by which the voltage level V of the bus line 12a must be greater than the reference voltage level $V_{ref}$ for a positive voltage differential to appear between the two inputs of the comparator 22, and the comparator 22 supplies a signal $S_{F1}$, representative for the occurrence of the positive signal edge F1.

With the occurrence of the positive signal edge F1 there is again a positive voltage differential between the two inputs of the differential amplifier 20 so that the capacitor C is charged further in accordance with the time constant τ until the reference voltage level $V_{ref}$ at the node S1 will have reached the value of the higher voltage level present on the bus line $12_a$.

The voltage differential between the two inputs of the comparator 22 will return to zero again when the capacitor C is charged to a voltage level which is less by the turned-on voltage of the diode D, i.e. the threshold value $\Delta U_s$, than the voltage level V of the bus line $12_a$. Once this state is attained, the output of the comparator 22 will be reset. This comparator 22 hence supplies a pulse-like signal $S_{F1}$, whose pulse width inter alia is dependent of the time constant τ of the series circuit containing the first resistor R1 and the capacitor C.

If the bus signal resumes the lower voltage level, the voltage level present at the node S2 will continue to remain smaller than the reference voltage level $V_{ref}$ so that the output signal $S_{F1}$ Of the comparator 22 will be kept at the lower level. However the capacitor C will discharge in accordance with the time constant τ down to the current quiescent voltage level of the bus line 12a.

The edge detector 14 just described accordingly supplies a pulse-like signal $S_{F1}$, representing the occurrence of a positive signal edge F1, such signal $S_{F1}$ being supplied to the evaluating circuit 16 for further processing.

Accordingly the edge detectors 14' having a similar structure, respectively supply a signal $S_{F2}$ representative for the occurrence of a negative signal edge F2, such signal $S_{F2}$ also being supplied for further processing to the common evaluating circuit 16 (see FIG. 1). These edge detectors 14' serving for the detection of negative signal edges F2 are preferably obtained by arranging the diode D with reverse polarity between the differential amplifier 20 and the comparator 22, the resistor R2 is connected with VCC instead of with ground M and the inputs of the comparator 22 are changed over.

Figure 3C:

The graph in FIG. 3C shows the variations with time of the output signal AS supplied by the evaluating circuit 16 and representative for the bus signal BS. From a comparison with the graphs in FIGS. 3A and 3B against time it may be seen that the evaluating circuit 16 only produces the output signal AS when after detection of the positive signal edge F1 the voltage level V present at the bus line 12a departs, during a predetermined minimum time $T_{min}$ by at least the predetermined relative threshold value $\Delta U_s$ from the reference voltage level $V_{ref}$.

Accordingly the evaluating circuit 16 only discontinues the output signal AS, when after detection of a negative signal edge F2 by an edge detector 14' the voltage level V present on the bus line 12a is less than the reference voltage level $V_{ref}$ during the predetermined minimum time $T_{min}$ by at least the predetermined relative threshold value $\Delta U_s$.

On the basis of the graphs in FIGS. 3A–3C the reader will be able to see that the evaluating circuit 16 does not produce any output signal AS as long as the voltage level V on the bus line 12a and, respectively, 12b merely changes, during the course of a sudden change in level, by a value, which is less than the predetermined relative threshold value $\Delta U_s$.

While in the graph in FIG. 3A against time this relative threshold value $\Delta U_s$ is exceeded by the second bus pulse, in this respect the pulse width is however less than the minimum time $T_{min}$, whereas the voltage level V present on the bus 12 must depart by at least the predetermined relative threshold value $\Delta U_s$ from the reference voltage level $V_{ref}$ in order for the evaluating circuit 16 to produce the output signal AS.

As will be seen from the graph in FIG. 3B against time after the short time of the second pulse the capacitor C is not yet charged up to the fu 11 value in accordance with the now quiescent voltage level. The output signal AS indicated in the graph of FIG. 3C is only produced after the threshold value $\Delta U_s$ has been exceeded and the predetermined minimum time $T_{min}$ has elapsed.

The graphs in FIGS. 3A–3C also indicate that the time constant τ, with which the reference voltage level $V_{ref}$ is adapted to the quiescent voltage level of the bus 12 or, respectively, with which the capacitor C is charged or discharged, is smaller than the predetermined minimum time $T_{min}$.

After a respective bus signal BS has been detected by the edge detector 14 and 14' only on the basis of its edges, it must be stored or, respectively, regenerated in the evaluating circuit 16. This is performed in a manner dependent on the signals $S_{F1}$, and $S_{F2}$ supplied by the edge detectors 14 and 14'.

Since in the illustrated working embodiment the circuit arrangement 10 is provided for a symmetrically operated two-wire bus 12, the signals $S_{F1}$, and $S_{F2}$ Of the pairs of edge detectors associated with the different bus lines 12a and 12b are preferably also combined in the evaluating circuit 16. If via the bus lines 12a and 12b for instance complementary signals are transmitted, then it is preferred for at least one further comparator or differential amplifier or, respectively, a corresponding logical system to be provided in the evaluating circuit 16 in order to compare the intermediate signals, derived from the complementary bus signals, with one another. The respective information is then preferably identified or characterized by a differential voltage instead of by an absolute level value, this meaning that an interfering pulse merely causes synchronous modulation, which owing to the formation of a difference by the respective comparator remains without effect.

The evaluating circuit 1–6 may also comprise an error recognition and indicating device 24 checking the various bus lines 12a and 12b as regards proper functioning thereof and be so designed that the circuit arrangement 10 may be switched over to single line operation on the failure of one bus line 12a or 12b. Such switching over is preferably performed automatically.

Figure 3D:
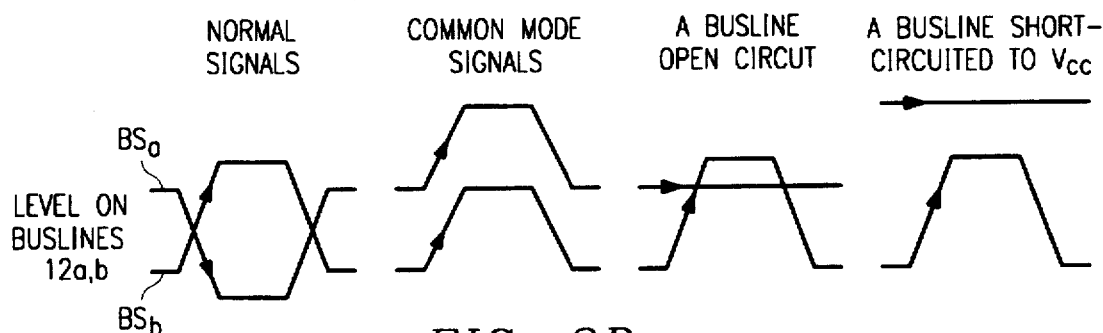
Figure 3E:
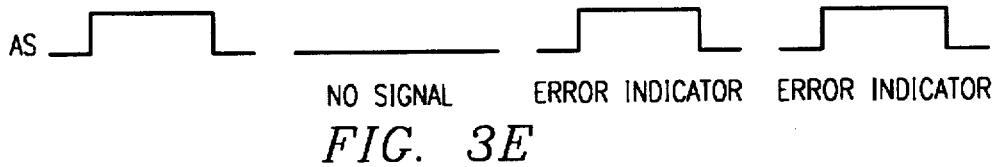

In the graphs in FIGS. 3D and 3A which show the variations with time of the voltage levels of the two complementary bus signals BSa and BSb and, respectively, the voltage level of the output signal AS, some examples for the operation in conjunction with a symmetrically operated two-wire bus are to be seen.

In the case of normal signal transmission two complementary bus signals BSa and BSb Synchronously occur on both bus lines 12a and 12b. Accordingly the evaluating circuit 16 produces an output signal AS representative for this bus signal BS.

In the case of the second example indicated an interfering signal occurs on the two bus lines 12a and 12b, something which however only causes synchronous modulation, which owing to the formation of a difference by a comparator additionally provided in the evaluating circuit 16 remains without effect. Accordingly no output signal AS is produced.

In the third case the bus line 12a is interrupted so that there is an automatic switching over to single line operation and the output signal AS is produced on the basis of the signals of the pair 14 and 14' of edge detectors associated with the intact bus line 12b. Simultaneously it is possible for the error recognition and indicating device 24 to indicate the error.

In the last case the bus line 12a is short-circuited after Vcc. In this case as well there is an automatic switching over to single line operation and the output signal AS is produced on the basis of the signals of the pair 14 and 14' of edge detectors associated with the intact bus line 12b. The error is again indicated by means of the error recognition and indicating device 24.

Figure 3F:
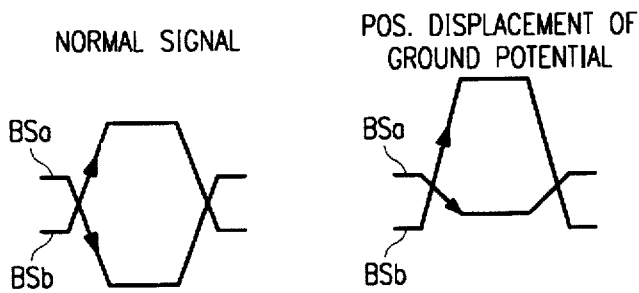

In the graph of FIG. 3F the case of normal signal transmission and normal signal reception is compared with a case in which on the reception of the signal transmitted via the bus line 12b there is a positive shift of ground potential. Since each bus signal is detected by means of edge detectors, in which the bus signal is compared with a reference voltage level continuously adapted to the respective quiescent voltage level, failure-free reception is ensured. Furthermore, it is possible for the circuit arrangement 10 to be switched over in the case of a complete failure of the bus line 12a in the above mentioned fashion to single line operation.

The manner of operation described of the circuit arrangement 10 above in connection with a possible failure of the bus line 12a is the same as in the case of possible failure of the other bus line 12b. In the latter case there is then a switch over to single line operation, in which the signals received via the intact bus 12a are evaluated.

The circuit arrangement described above is basically also suitable for single wire operation or an asymmetrically operated bus system. In this case it is sufficient to use one of the two pairs 14 and 14' of edge detectors depicted in FIG. 1.

It is basically also possible as well, for each respective bus line, to provide only one edge detector, which supplies both the signal representative of the occurrence of the positive signal edge and also the signal representative for the occurrence of the negative signal edge.

I claim:

1. A bus signal detector for use with (i) a first bus voltage signal variable between a time-varying first quiescent voltage and a more positive first signal voltage, and (ii) a complementary second bus voltage signal variable between a time-varying second quiescent voltage and a more negative second signal voltage, comprising:

first and second input terminals for respectively receiving the first and second bus voltage signals;

a first detecting pair of positive-edge & negative-edge detectors respectively coupled to the first input terminal, for respectively generating a positive-edge or negative-edge signal according to whether the first bus voltage signal switches by at least a predetermined threshold voltage (i) from the first quiescent voltage to the more positive first signal voltage or (ii) the reverse; and a second detecting pair of positive-edge & negative-edge detectors respectively coupled to the second input terminal, for respectively generating a negative-edge or positive-edge signal according to whether the second bus voltage signal switches by at least the threshold voltage (i) from the second quiescent voltage to the more negative second signal voltage or (ii) the reverse; and a common evaluating circuit coupled to the first and second detecting pairs for generating an output signal AS which is normally INACTIVE but becomes ACTIVE in response to positive-edge and negative-edge signals respectively from the first and second detecting pairs for at least a predetermined minimum interval, and returns to INACTIVE in response to negative-edge and positive-edge signals respectively from the first and second detecting pairs for at least a predetermined minimum interval.

2. The bus signal detector of claim 1 wherein:

the positive-edge detectors each comprise an input, a differential amplifier for charging a first capacitor to the input's voltage, and a comparator for generating a positive-edge signal only when the input's voltage exceeds the capacitor's by at least the threshold voltage; and the negative-edge detectors each comprise an input, a differential amplifier for charging a second capacitor to the input's voltage, and a comparator for generating a negative-edge signal only when the input's voltage is less than the capacitor's by at least the threshold voltage.

3. The bus signal detector of claim 1 wherein the common evaluating circuit comprises an error detector for detecting an error when either the first or second bus signal is unavailable because of an open-circuit or short; and the common evaluating circuit can respond to the error detected by the error detector by generating the output signal AS in response to the remaining available first or second bus signal alone.

* * * * *